(12) United States Patent
Karr et al.

(10) Patent No.: US 6,534,425 B1
(45) Date of Patent: Mar. 18, 2003

(54) MASK DESIGN AND METHOD FOR CONTROLLED PROFILE FABRICATION

(75) Inventors: Brian W. Karr, Savage, MN (US); Lance E. Stover, Eden Prairie, MN (US); Jianxin Zhu, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 196 days.

(21) Appl. No.: 09/665,093

(22) Filed: Sep. 20, 2000

Related U.S. Application Data
(60) Provisional application No. 60/168,859, filed on Dec. 2, 1999.

(51) Int. Cl.$^7$ ................................................ G03F 9/00
(52) U.S. Cl. .................. 438/947; 438/949; 430/312; 430/313; 430/5; 430/322; 250/492.2; 250/492.22
(58) Field of Search .................. 250/492.2, 492.22; 438/947, 949; 430/312, 313, 322, 5

(56) References Cited

U.S. PATENT DOCUMENTS

| | | | |
|---|---|---|---|
| 4,415,262 A | 11/1983 | Koyama et al. | 355/125 |
| 4,701,766 A | 10/1987 | Sugitani et al. | 346/1.1 |
| 4,758,305 A | 7/1988 | Bonifield et al. | 156/643 |
| 4,938,841 A | 7/1990 | Shahar et al. | 156/661.1 |
| 5,004,673 A | 4/1991 | Vlannes | 430/325 |
| 5,208,125 A | 5/1993 | Lowrey et al. | 430/5 |
| 5,538,817 A | 7/1996 | Smith et al. | 430/5 |
| 5,672,450 A * | 9/1997 | Rolfson | 430/5 |
| 5,776,638 A | 7/1998 | Park et al. | 430/5 |
| 5,999,368 A | 12/1999 | Katayama | 360/103 |
| 6,376,131 B1 * | 4/2002 | Cho et al. | 430/5 |

FOREIGN PATENT DOCUMENTS

| | | |
|---|---|---|
| EP | 0 731 387 A2 | 9/1996 |
| EP | 0 499 944 B1 | 4/1997 |

OTHER PUBLICATIONS

James B. Kruger et al., "Trilayer Resist", VLSI Electronics Microstructure Science, vol. 8, 1984, pp. 91–136.

* cited by examiner

Primary Examiner—Bruce Anderson
Assistant Examiner—Nikita Wells
(74) Attorney, Agent, or Firm—Westman, Champlin & Kelly, P.A.

(57) ABSTRACT

A photolithography reticle for use in conjunction with an exposure tool to produce a tapered sidewall profile in photoresist includes a solid portion and multiple sub-resolution line portions. The solid portion has a width which is greater than a resolution of the exposure tool. The sub-resolution line portions have widths which are less than the resolution of the exposure tool. Each of the sub-resolution line portions is spaced apart from the solid portion and from the others of the plurality of sub-resolution line portions by less than the resolution of the exposure tool.

14 Claims, 12 Drawing Sheets

FIG. 1

PRIOR ART

| FOCUS OFFSET | A | B1 | B2 | R² |
|---|---|---|---|---|
| +6 | 35.6 | -1.59 | 0.0168 | 0.99 |
| -6 | -5.18 | 0.367 | -0.0059 | 0.99 |
| BEST FOCUS | 7.16 | -0.193 |  | 0.97 |

MASK DESIGN AND METHOD FOR CONTROLLED PROFILE FABRICATION

CROSS-REFERENCE TO RELATED APPLICATION

This application claims priority from U.S. Provisional Application No. 60/168,859, filed Dec. 2, 1999, and entitled "MASK DESIGN FOR CONTROLLED PROFILE FABRICATION."

BACKGROUND OF THE INVENTION

The present invention relates generally to fabrication of magnetic recording heads or other structures having a sloped profile or surface. More particularly, the present invention relates to photolithography reticle designs and fabrication techniques for generating sloped photoresist profiles.

As areal density in magnetic disc drive recording increases, at a rate of greater than 100% per annum, the head/disc spacing continues to shrink. The introduction of ramp load/unload, for desktop as well as mobile computer disc drives, also increases the opportunity for contact between the head and media. Without air bearing surface (ABS) designs which allow "friendly" interaction between heads and recording media, deformation of the media will result. Under extreme Pitch Static Attitude (PSA) and Roll Static Attitude (RSA) conditions, portions of the ABS and slider body are subject to contact with the recording media. This type of contact leads to burnishing of the head, which results in debris in the data zone, and/or plastic deformation of the recording media.

Sharp corners on a magnetic recording head, where the load is concentrated in a small area, have shown the highest incidence of plastic deformation of the media. In an effort to eliminate and/or reduce the amount of burnishing and/or plastic deformation, ABS designs have been modified to provide contact protection. Several features, such as pedestals, have been added to the ABS design to control the area where contact occurs. Also, in an effort to minimize the effect of controlled contact between the head and media, abrupt edges have been replaced with tapered sidewalls. To fabricate a tapered sidewall on an ABS, a tapered photoresist profile is generated, and the profile is generally transferred to the ABS during etching. Control of the resist profile angle while using a conventional chrome photolithography reticle has proven difficult.

Previous researchers have produced tapered profiles using selectively etched multi-layered masks and variable optical density reticles, both of which are costly and difficult to manufacture.

SUMMARY OF THE INVENTION

A photolithography reticle for use in conjunction with an exposure tool to produce a tapered sidewall profile in photoresist includes a solid portion and multiple sub-resolution line portions. The solid portion has a width which is greater than a resolution of the exposure tool. The sub-resolution line portions have widths which are less than the resolution of the exposure tool. Each of the sub-resolution line portions is spaced apart from the solid portion and from the others of the plurality of sub-resolution line portions by less than the resolution of the exposure tool.

DETAILED DESCRIPTION OF THE PREFERRED EMBODIMENTS

The present invention includes processes and reticle designs, which permit the fabrication of tapered sidewall profiles in photoresist. A diffraction grating has been utilized to "blur" the light at the edge of chrome on a conventional 1× or 5× photolithography reticle. Tapered sidewall profiles are produced utilizing the effects of diffraction from a variable pitch array of sub-resolution lines and spaces. Fraunhofer diffraction from a grating can be used to model the results from variable pitch lines and spaces with excellent correlation to experimental results used to confirm the results of the present invention.

Sloped photoresist profiles have been used to bevel the edge of the Air Bearing Surface (ABS) of a magnetic data head. In certain applications these profiles are intended to serve as contact protection features during loading and unloading of a full-rotating disk, while in other applications, such as leading edge taper, the features can be utilized to produce large-scale multi-step profiles. A disc drive data storage system of the type which utilize data heads having an ABS fabricated using the processes and reticle designs of the present invention is shown and discussed briefly in FIG. 1.

Figure 1:
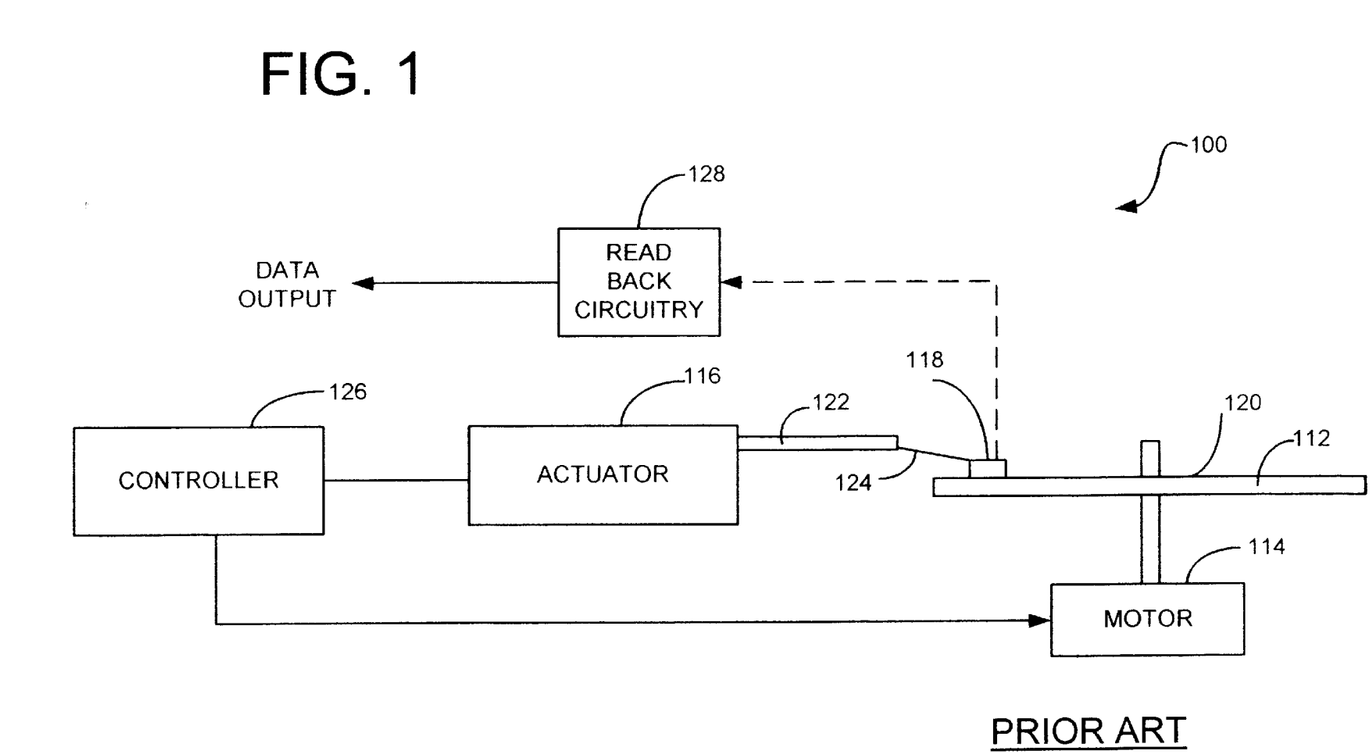
FIG. 1 is a diagrammatic illustration of a disc drive data storage system utilizing a magnetic data head of the type which can be fabricated using the methods of the present invention.

Disc drive data storage system 100 includes storage medium 112 such as a magnetic disc, which is rotated by motor 114. An actuator 116 is coupled to a data head slider 118 to position the data head over a surface 120 of disc 112. Actuator 116 includes actuator arm 122, which is attached to slider 118 via suspension 124. A controller 126 controls positioning of slider 118. Variations in a magnetic field applied to the data head slider 118 due to magnetization of disc 112 cause a change in the electrical resistance of the sensor. This change in electrical resistance is detected with read back circuitry 128 which responsively provides data output. Chrome photolithography reticles, and methods of using the same to produce sloped or tapered sidewalls in photoresist, are described below. These reticles and methods can be used to fabricate the ABS of data head slider 118 for use in this type of disc drive data storage systems.

Figure 2A:
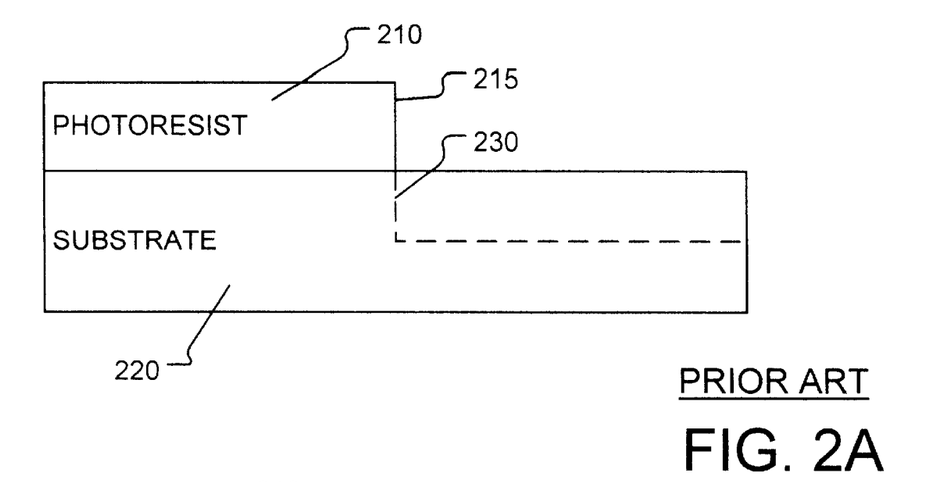
FIGS. 2A and 2B illustrate prior art thin film fabrication techniques used to form a sloped surface or profile on a substrate.
Figure 2B:
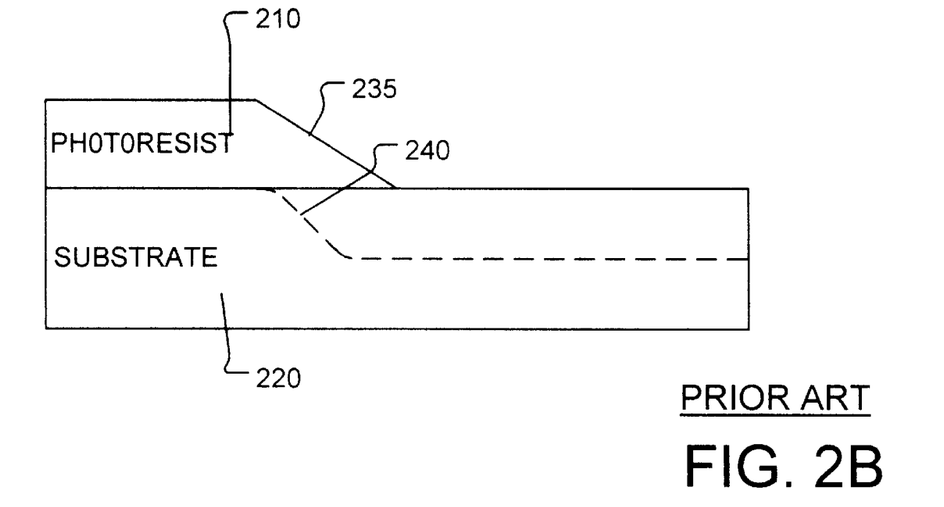

FIGS. 2A and 2B are diagrammatic side-view illustrations which demonstrate the effect of a sloped photoresist profile in forming a sloped substrate. As shown in FIG. 2A, photoresist 210 having a non-sloped edge 215 has been deposited upon substrate 220. With this photoresist profile, etching of photoresist 210 and substrate 220 will result in a non-sloped substrate surface 230 being formed. In contrast, as is known in the art, a sloped substrate profile or surface 240 can be obtained by forming a sloped photoresist surface 235. Then, when etching photoresist 210 and substrate 220, sloped surface 240 will be formed. The present invention includes chrome photolithography reticles which can be used to form sloped photoresist surfaces, and which can thereby be used to create sloped substrate surfaces. The present invention also includes methods of using these reticles.

Figure 3A:
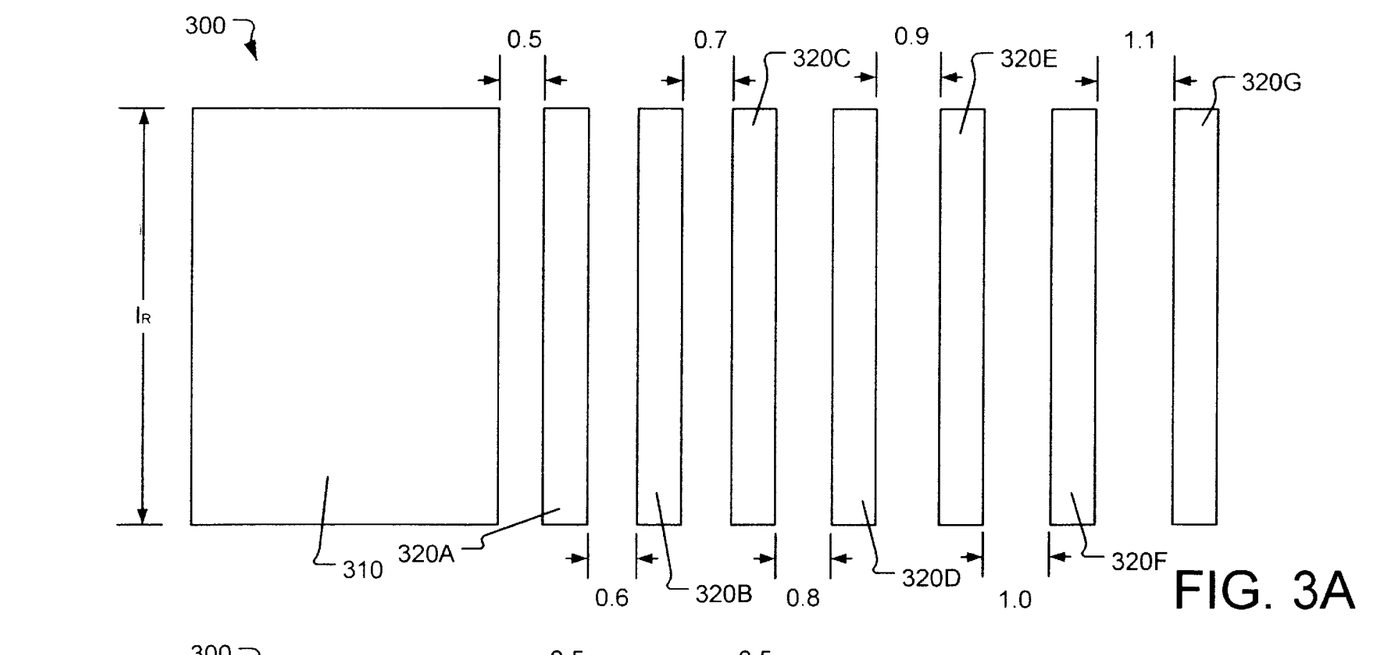
FIGS. 3A and 3B are top and side diagrammatic illustrations of a chrome photolithography reticle, in accordance with the present invention, which can be used to generate sloped photoresist surfaces or profiles.
Figure 3B:
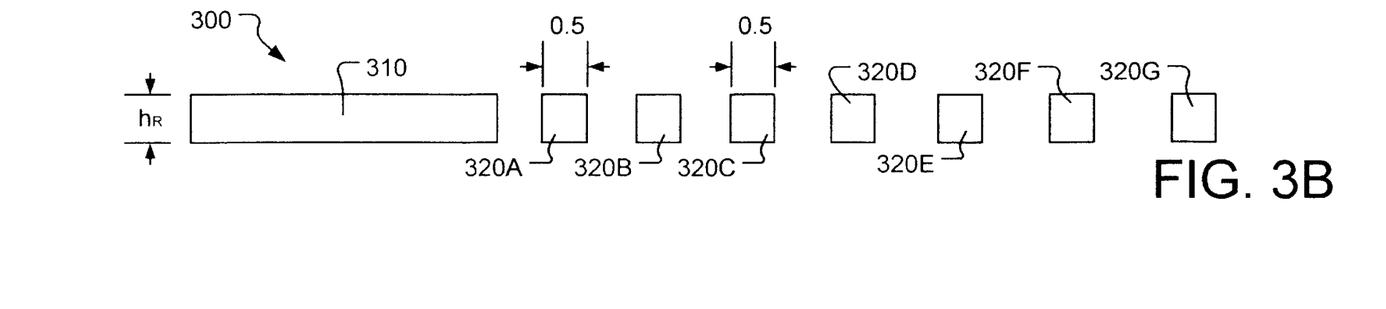

A structure for the reticle design for generating tapered sidewalls is illustrated in the top and side views of FIGS. 3A and 3B. Reticle 300 shown in FIGS. 3A and 3B is a chrome photolithography reticle having solid chrome portion 310 and an array 320 of sub-resolution lines having variable pitch spaces therebetween. As shown in FIGS. 3A and 3B, array 320 includes sub-resolution lines 320A, 320B, 320C, 320D, 320E, 32OF and 320G. More or fewer sub-resolving lines can be included. In this particular embodiment, each of sub-resolution lines 320A–32OG has an identical width. In the embodiment shown, the width of sub-resolution lines 320 is 0.5 $\mu$meter. Also in this embodiment, a spacing between each sub-resolution line increases incrementally by fixed amounts. For example, sub-resolution line 320A is 0.5 $\mu$meters from solid chrome portion 310, while sub-resolution line 320B is 0.6 $\mu$meter from sub-resolution line 320A. As illustrated, the subsequent spacings or pitches between sub-resolution lines is 0.7 $\mu$meter, 0.8 $\mu$meter, 0.9 $\mu$meter, 1.0 $\mu$meter and 1.1 $\mu$meter. Various other patterns of incremental spacing can be used with the present invention, as is discussed later with reference to FIGS. 11A–11C. Also, while each of sub-resolution lines 320A–320G of reticle 300 are shown to have the same width, in other embodiments the widths of the various sub-resolution lines case vary. In the illustrated embodiments, reticle 300 has a uniform thickness $h_R$, which provides advantages over some prior art reticles. Also, in the illustrated embodiment, each of solid portion 310 and sub-resolution lines 320 have a uniform length $l_R$.

Tapered sidewall angle capability results from the array of sub-resolution lines and variable pitch spaces between sub-resolution lines. In the illustrated embodiment, the pitch of the space between sub-resolution lines increases with the distance from solid chrome portion 310 of reticle 300. As noted above, each of sub-resolution lines 320A–320G can be of an identical width, or alternatively can be of varying widths. Further, the variation of the increasing spacing between sub-resolution lines can be in accordance with many different patterns. However, in these various embodiments, both the widths of all sub-resolution lines 320, as well as the spacing between adjacent sub-resolution lines, should be less than the resolution of the exposure tool used during the fabrication process. If the widths of the sub-resolution lines are not less than a wavelength corresponding to the tool resolution, then scattering of the ultraviolet (UV) light from the exposure tool will not be achieved.

Figure 4A:
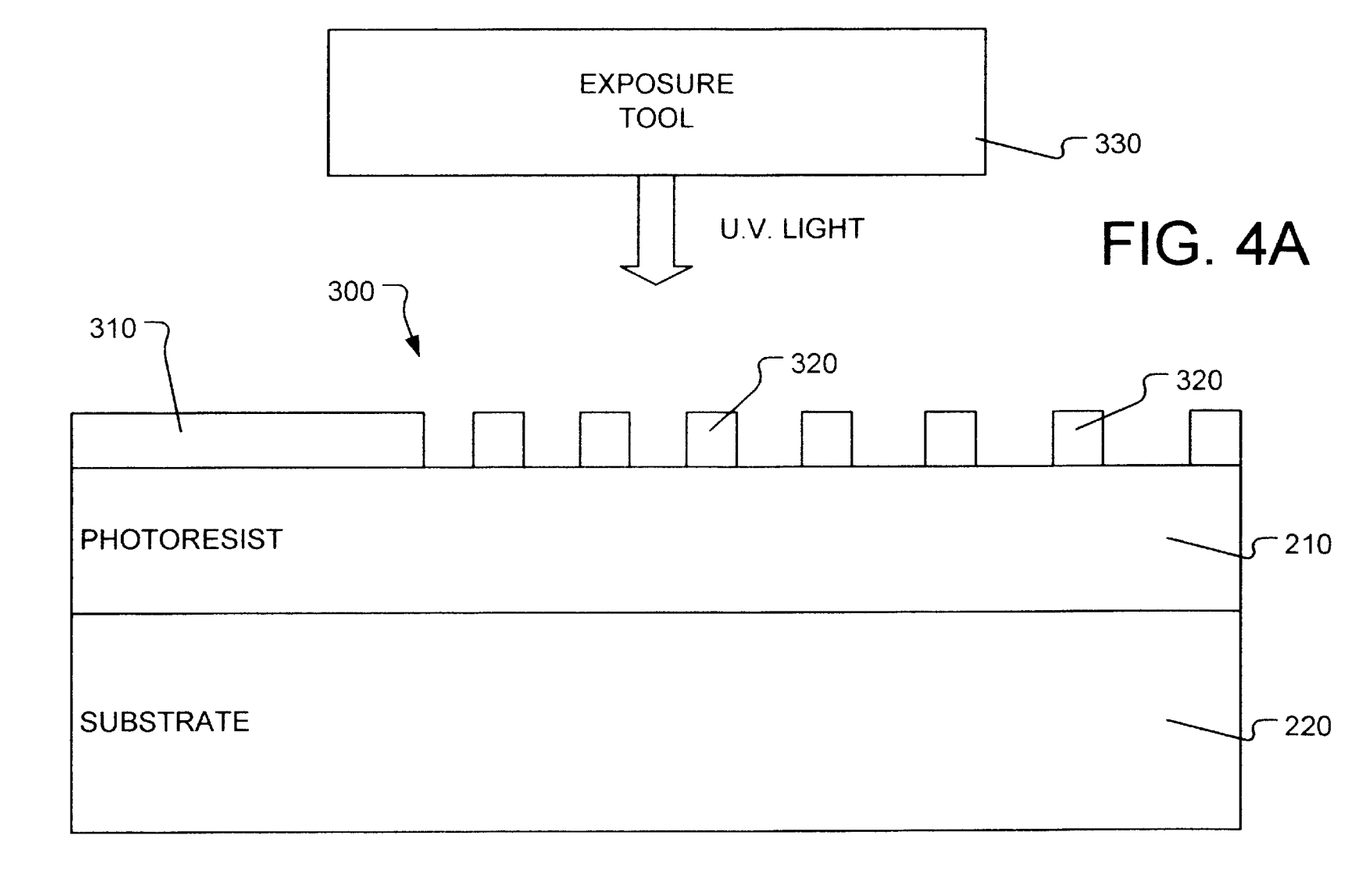
FIGS. 4A and 4B are diagrammatic side illustrations showing steps in a method of generating a sloped photoresist profile or surface.

FIGS. 4A and 4B diagrammatically illustrate a process of producing a tapered or sloped sidewall 235 in photoresist 210, which can then be transferred to a substrate 220. As shown in FIG. 4A, photoresist 210 is deposited upon substrate 220. Photo mask 300, having solid chrome portion 310 and incrementally increasingly spaced sub-resolution lines 320, is placed on top of, or in close proximity to, photoresist 210. Next, exposure tool 330 exposes photoresist 210 using UV light having a resolution wavelength which is greater than both the widths of sub-resolution lines 320, and the spacing between sub-resolution lines. These sub-resolution line-space pairs produce an effect similar to a Fraunhofer diffraction grating. Fraunhofer diffraction, light source placed at infinity, is used rather than Frensel diffraction since the Fraunhofer approximation assumes a plane wave traveling normal to the diffraction grating. Mathematically, the spherical waves used in Frensel diffraction are much more difficult to handle. Assuming that the illumination is a plane wave, the Fourier Transform of the amplitude will yield the diffraction pattern of an aperture, or grating.

Figure 4B:
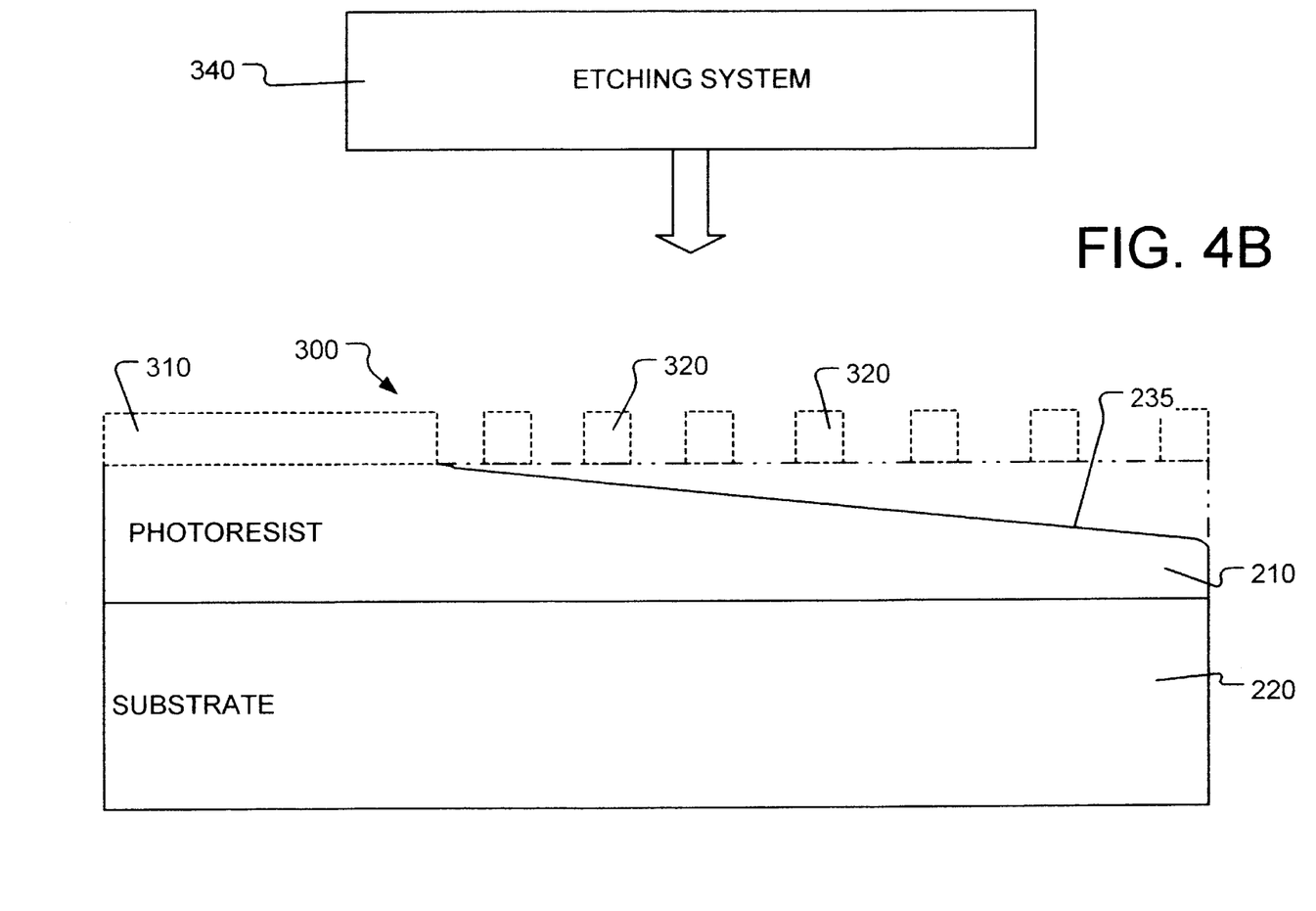
Figure 5A:
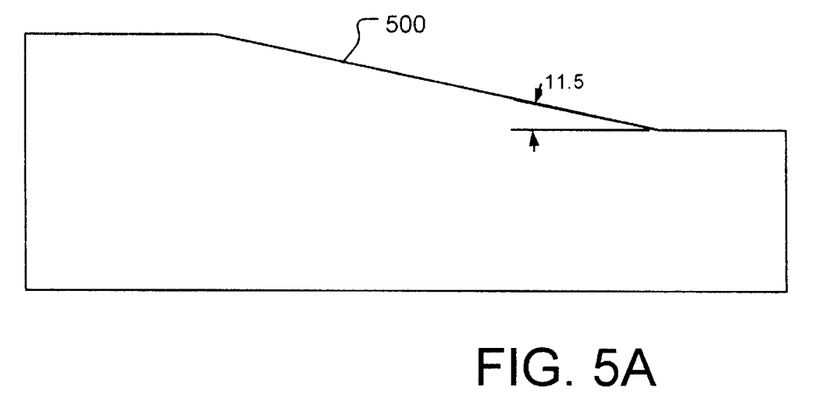
FIGS. 5A and 5B are diagrammatic side views illustrating an 11.5 degree angle bevel generated using a 0.1 µm increment reticle and a 35 degree angle generated using a 0.5 µm increment reticle, respectively.
Figure 5B:
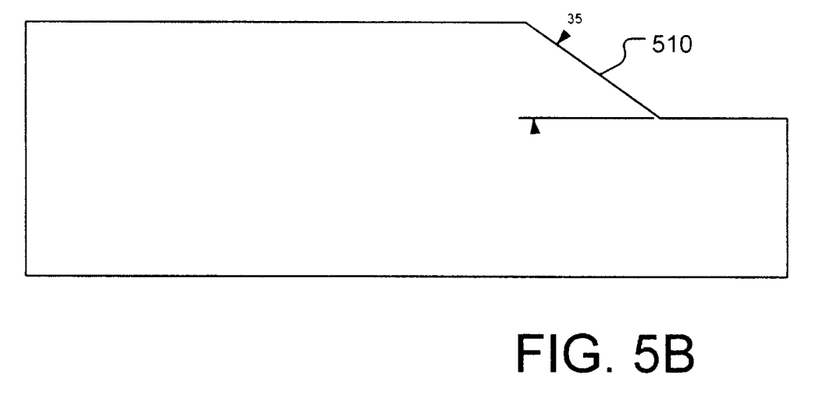

As shown diagrammatically in FIG. 4B, after providing varying amounts of exposure to photoresist 210 with the aid of photo mask 300, photo mask 300 and portions of photoresist 210 are removed using a chemical wash or other processes of the type known in the art. Because portions of photoresist 210 furthest from solid chrome portion 310 have received greater exposure through the increased spacing between sub-resolution lines 320, more of these furthest portions of photoresist 210 are removed during the chemical wash process. The result is a sloped or tapered sidewall 235 formed in photoresist 210. After removal of photo mask 300 and portions of photoresist 210, an etching system 340 is used to etch away portions of photoresist 210 and substrate 220. Thus, as is known in the art, tapered sidewall 235 is transferred to substrate 220 (step not shown in FIG. 4B) as is shown in prior art FIG. 2B. Etch profiles formed using the tapered sidewall reticles of the invention are shown in FIGS. 5A and 5B. The profiles 500 and 510 shown in FIGS. 5A and 5B correspond to 0.1 $\mu$meter and 0.5 $\mu$meter increment variable pitch lines and spaces. This illustrates that a range of taper angles can be achieved by varying the spacing between sub-resolution lines.

Figure 6:
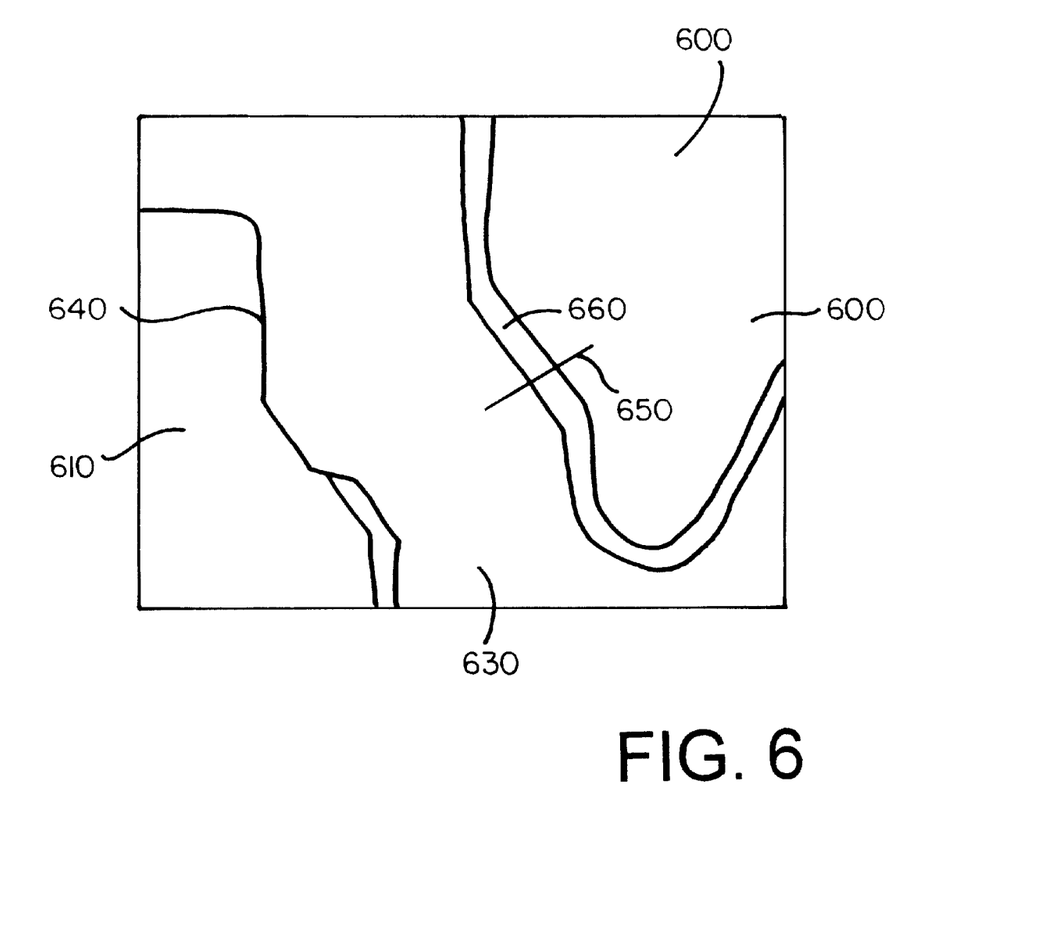
FIG. 6 is a diagrammatic illustration of an optical micrograph which shows the difference between a typical cavity wall transition and a wall transition resulting from sub-resolution lines and variable pitch spaces of the reticles of the present invention.
Figure 7:
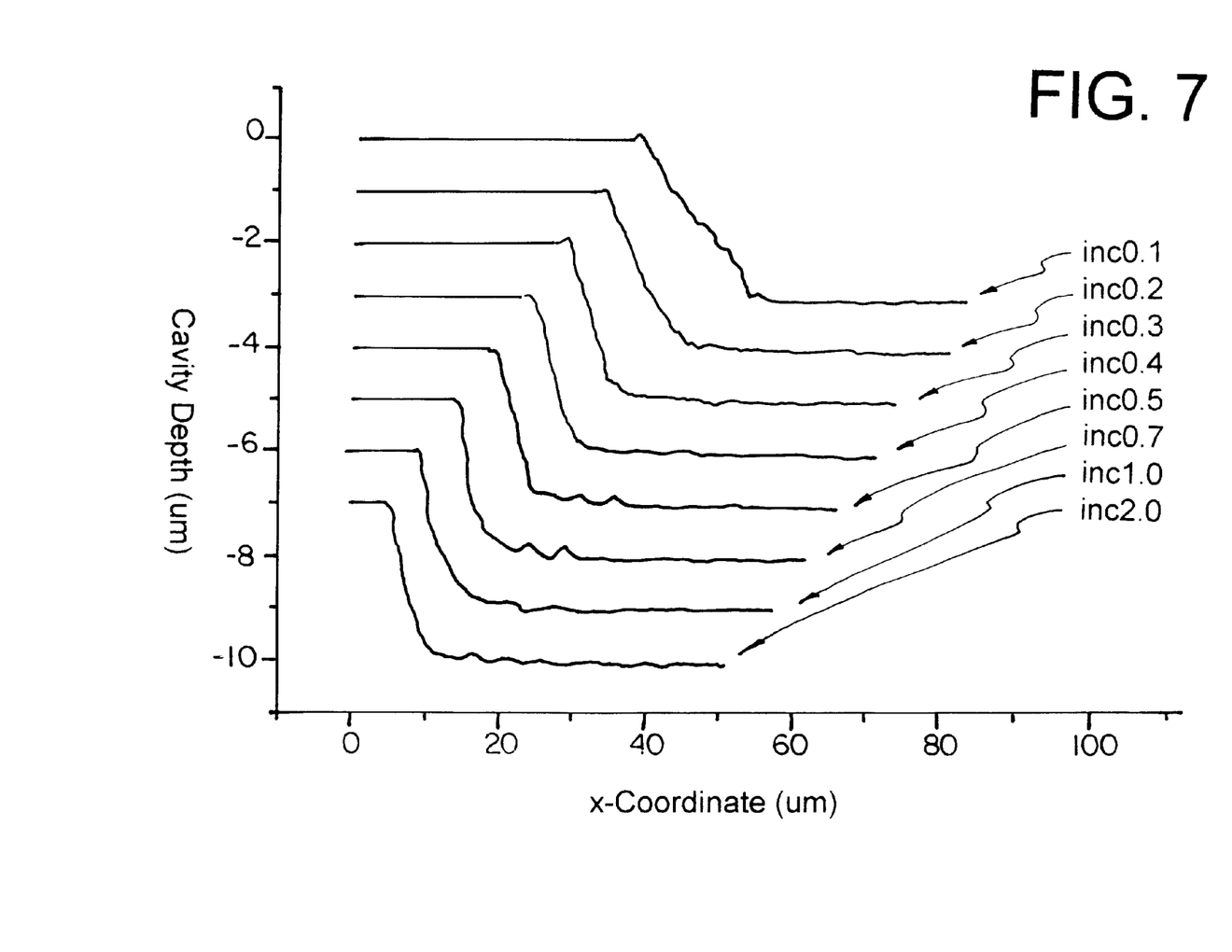
FIG. 7 is a plot which illustrates bevel profiles as a function of increment in the reticles of the present invention.
Figure 8:
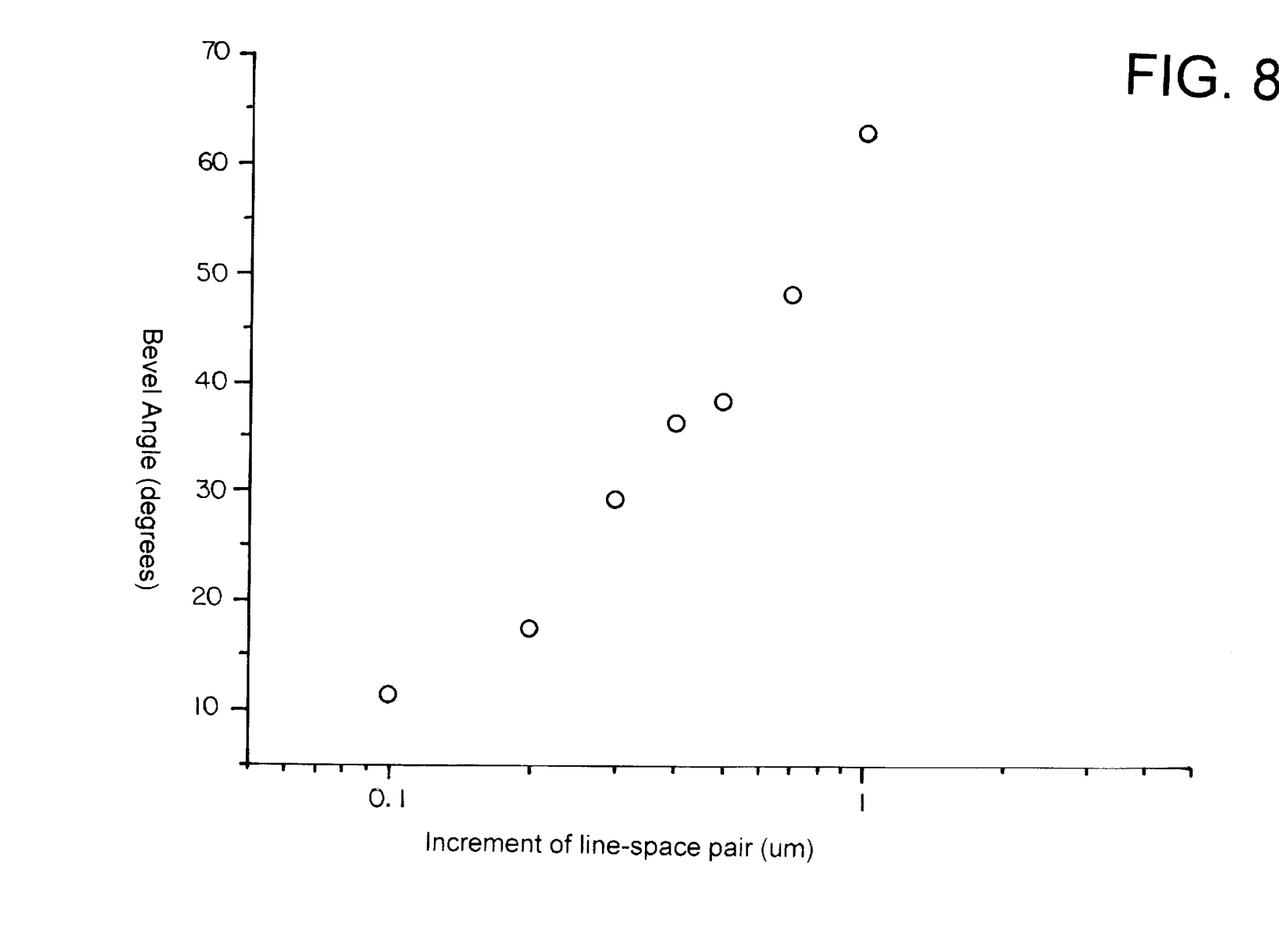
FIG. 8 is a plot illustrating bevel profiles as a function of variable pitch space increment.

Tapered ABSs have been fabricated using an array of sub-resolution lines and variable pitch spaces as described above. FIG. 6 shows a plan-view micrograph of the cavity transitions in an ABS 600 fabricated with and without the sub-resolution lines and variable pitch spaces. As shown in FIG. 6, ABS 600 includes etched portion 630 separating two non-etched portions 610 and 620. FIG. 6 illustrates the difference between a typical cavity wall transition 640 between etched and non-etched portions, and a wall transition 660 resulting from use of the sub-resolution lines and variable pitch spaces of the reticles of the present invention. As can be seen in FIG. 6, where a conventional reticle was used to expose the photoresist, a relatively sharp edge transition 640 is generated on the substrate during etching. However, when reticles of the present invention are used, a sloped transition surface 660 (sloping along a general direction of line 650) is achieved between the etched and non-etched surfaces when etching through the sloped photoresist profile. Profiles produced with sub-resolution line-space pairs, or a grated reticle, are shown in FIG. 7. These profiles are measured by either interferometer or surface profilometer scans along the direction of line 650 in FIG. 6. The profile angle as a function of increment of the pitch is shown in FIG. 8. This data was generated by utilizing the portion of the etch profile, shown in FIG. 7, which is not a result of photoresist shadowing. FIG. 8 shows that sub-resolution lines and variable pitch spaces are capable of producing tapers over a large range of angles, from at least about 11.5° to at least about 60°.

Figure 9A:
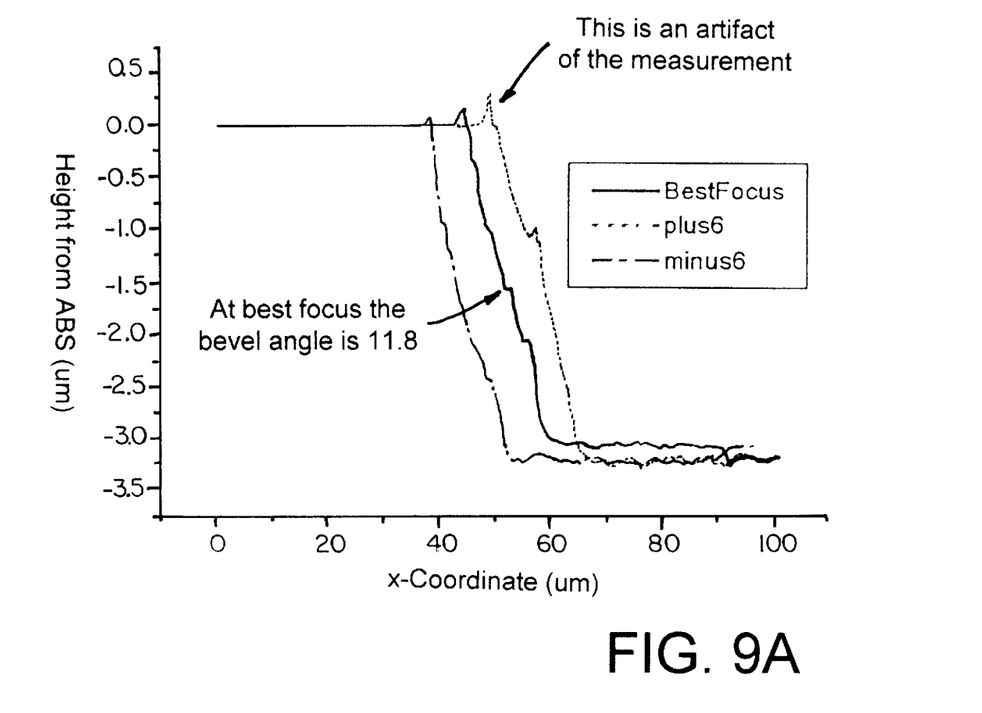
FIG. 9A is a plot illustrating bevel profile as a function of stepper focus, relative to a best focus.
Figure 9B:
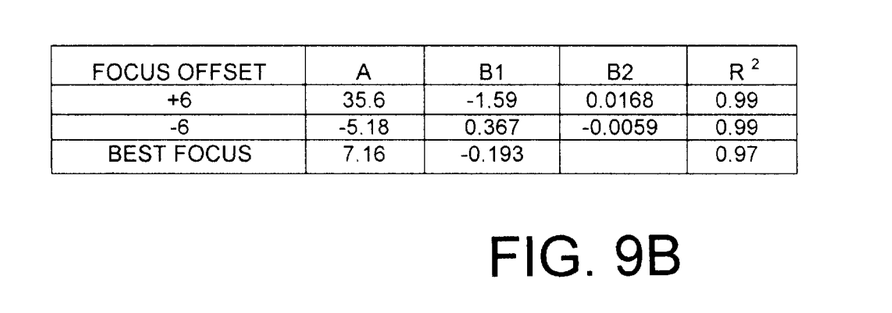
FIG. 9B is a table illustrating polynomial and linear fit parameters to the data shown in FIG. 9A.
Figure 10:
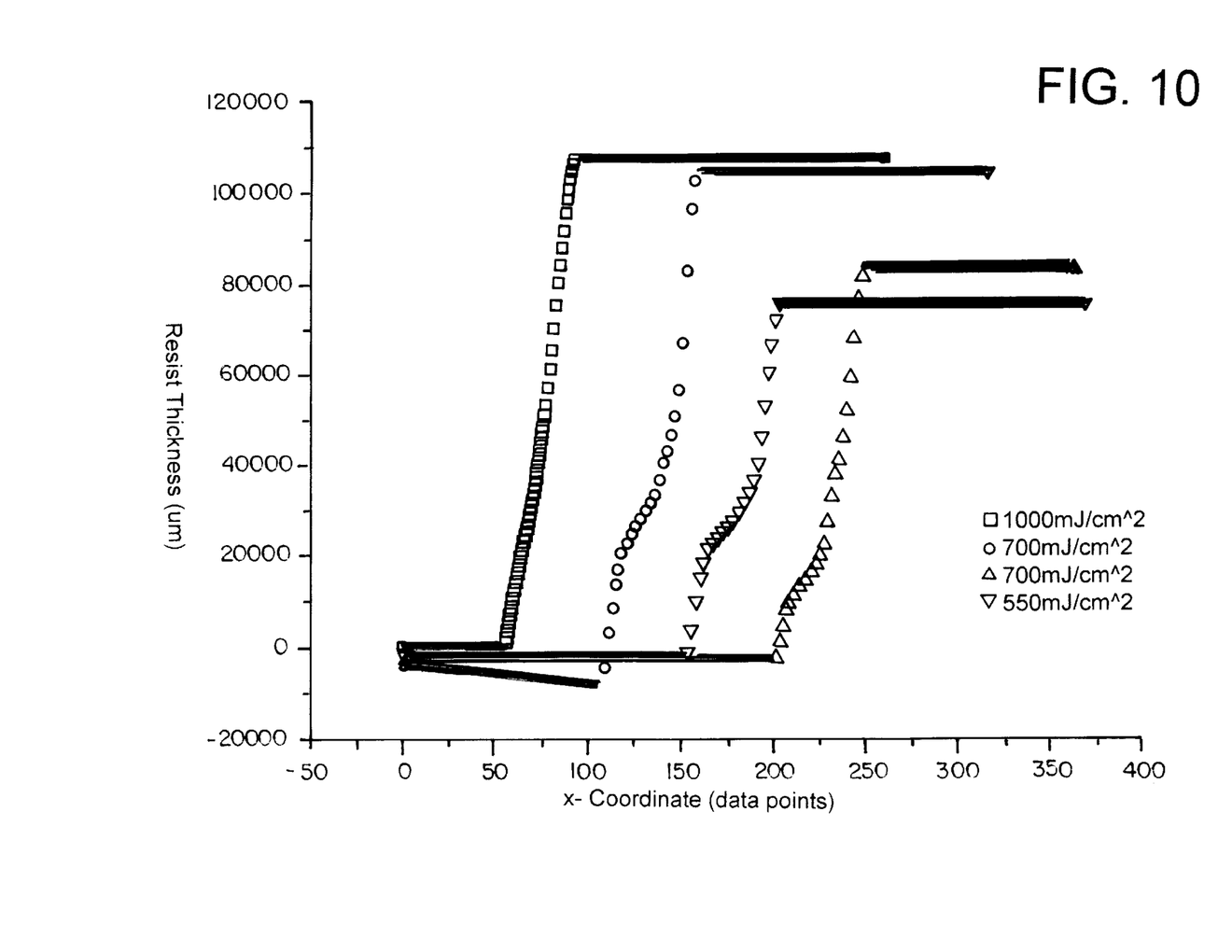
FIG. 10 is a bevel profile in photoresist for two thicknesses of resist at four different exposure energies.

Variation of photolithography parameters such as focus offset, exposure dose, and resist thickness was measured for utilization of the sub-resolution lines and variable pitch spaces. Effects of process variation for the etching of a tapered profile were determined for cavity depth, and selectivity. The profile angle as a function of the stepper focus is shown in FIG. 9A. Fits for each of the curves are also provided in Table 1 shown in FIG. 9B. The limits of the range investigated for focus/de-focus were determined from the standard deviation of slider's z-height variation at bar assembly. The profile change as a function of stepper exposure is shown in FIG. 10. Resist profiles were determined using a Tencor profilometer. FIG. 10 illustrates bevel profiles in photoresist for two thicknesses of resist. The data indicates that underexposure can lead to a "knee" which forms at the base of the photoresist pattern. Each of profiles shown corresponds to an exposure processing the amounts indicated. The 1000 mJ\cm$^2$ and the 700 mJ\cm$^2$ exposures correspond to photoresist which was 11.5 μm thick. The profiles for the exposure process of 550 mJ\cm$^2$ and 700mJ\cm$^2$ correspond to underexposing photoresist having a thickness of 8.5 μm. As can be seen, as the dose increased, the knee moves downward.

Figure 11A:
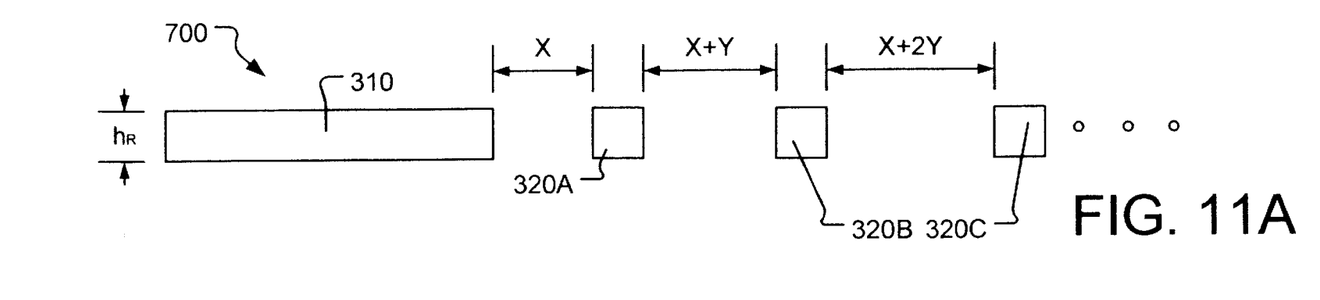
FIGS. 11A–11C are diagrammatic side views of alternate reticle embodiments in accordance with the invention.
Figure 11B:
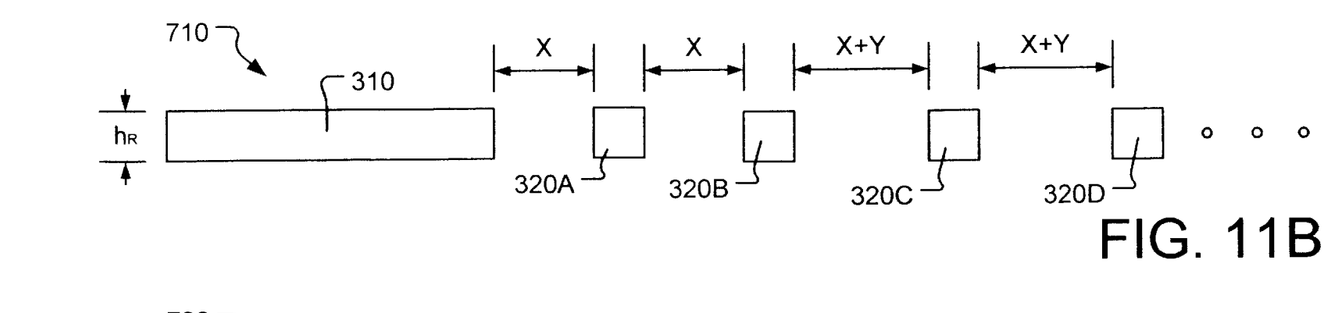
Figure 11C:
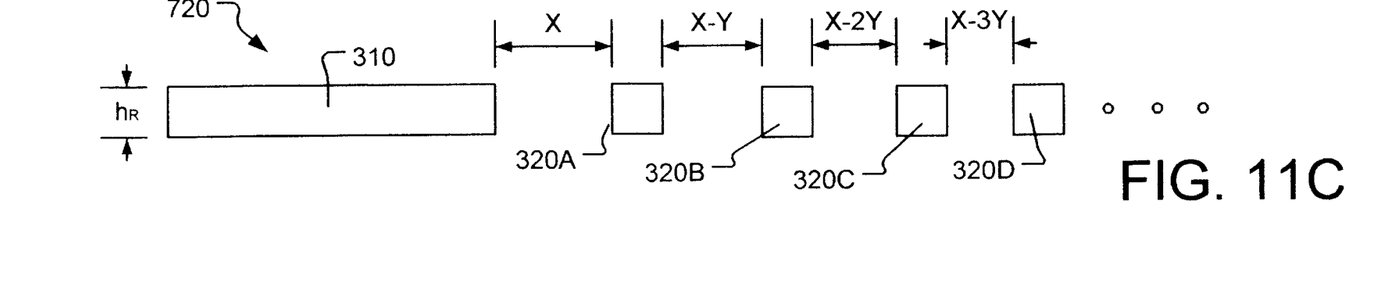

FIGS. 11A–11C illustrate other embodiments of the chrome photolithography reticles of the present invention. As shown in FIG. 11A, reticle 700 includes solid chrome portion 310 and multiple sub-resolution lines 320 (only lines 320A–320C are shown) as was the case with reticle 300 illustrated in FIG. 3. Like reticle 300, in reticle 700 the increase in pitch or spacing between sub-resolution lines is a linear function increasing with distance from solid portion 310. For example while the spacing between sub-resolution line 320A and solid portion 310 is X, the spacing between sub-resolution lines 320B and 320A is X+Y. Likewise, the spacing between sub-resolution lines 320C and 320B increases linearly, relative to the previous spacing, to a value of X+2Y. In these embodiments, the spacing between adjacent sub-resolution lines should be less than the resolution of the exposure tool used to expose the photoresist.

Reticle 710 illustrated in FIG. 11B differs slightly from reticle 700 illustrated in FIG. 11A in that it employs a different pattern of increased spacing between adjacent sub-resolution lines 320. In reticle 710 illustrated in FIG. 11B, the spacing between sub-resolution lines 320B and 320A is X, which is the same as the spacing between sub-resolution line 320A and solid chrome portion 310. Likewise, the spacing between sub-resolution lines 320B and 320C and between sub-resolution lines 320C and 320D is identical and equal to X+Y. In other words, while the spacing between sub-resolution lines increases as a function of distance from solid chrome portion 310, it is not necessary that each spacing increase relative to the immediately adjacent spacing.

In reticle 720 illustrated in FIG. 11C, a reticle design is shown which uses decreased spacing, as a function of distance from solid chrome portion 310, between adjacent sub-resolution lines 320. As illustrated, despacing between sub-resolution line 320A and solid portion 310 is X, while the spacing between sub-resolution lines 320A and 320B is X−Y. Likewise, the spacing between sub-resolution lines 320B and 320C is X−2Y, while the spacing between sub-resolution lines 320C and 320D is X−3Y. This would result in a photoresist profile with a shape other than the slope illustrated in FIG. 2B.

To summarize, using an array of sub-resolution lines and variable pitch spaces, a "pseudo" gray-scale mask can be fabricated from a binary chrome mask for applications in a multi-level resist process. By utilizing patterned sub-resolution pixel element on a binary mask, the light transmission can be modulated such that discrete resist thickness levels can be formed after develop. Using an optical transmission photo mask, a pattern controlled slope geometry ("taper") on a slider ABS can be fabricated. Modeling indicates that the benefit of such a taper design will be improved stability to flying height and fast take-off response. Also, the taper can potentially eliminate the current step mask such that it may double the ABS photolithography process manufacturing capacity. The advantages of this approach includes that a range of taper profiles can be fabricated using conventional reticle manufacturing processes at a fraction of the cost of alternative grey-scale reticles. Also, these techniques can be utilized for multi-angle reticles as well as multi-discrete-step reticles. Further, utilization of these reticles does not disturb the current process flow. No extraordinary measures are required to accommodate the fabrication of sloped features into normal processing. Processing with a sub-resolution lines and variable pitch space reticle does require the use of non-standard milling processes, i.e., more normal etch angles of incidence, due to shadowing.

Although the present invention has been described with reference to preferred embodiments, workers skilled in the art will recognize that changes may be made in form and detail without departing from the spirit and scope of the invention.

What is claimed is:

1. A photolithography reticle for use in conjunction with an exposure tool to produce a tapered sidewall profile in photoresist, the reticle comprising:

solid reticle means for substantially blocking ultraviolet radiation from the exposure tool a solid reticle means having a width which is greater than a resolution of the exposure tool; and sub-resolution reticle means for diffracting ultraviolet radiation from the exposure tool to provide varying amounts of exposure to the photoresist including a plurality of sub-resolution line portions, wherein each of the sub-resolution line portions is spaced apart from the solid portion and from the others of the plurality of sub-resolution line portions.

2. A photolithography reticle for use in conjunction with an exposure tool to produce a tappered sidewall profile in photoresist, the reticle comprising:

a solid portion having a width which is greater than a resolution of the exposure tool; and a plurality of sub-resolution line portions, wherein each of the plurality of sub-resolution line portions has a width which is less than the resolution of the exposure tool, and wherein each of the sub-resolution line portions is spaced apart from the solid portion and from the others of the plurality of sub-resolution line portions, and wherein for each of the plurality of sub-resolution line portions, spacings between the sub-resolution line portion and adjacent sub-resolution line portions are substantially a function of distance between the sub-resolution line portion and the solid portion of the reticle.

3. The photolithography reticle of claim 2, wherein spacing between particular sub-resolution line portions and adjacent sub-resolution line portions increases as a function of distance between the particular sub-resolution line portions from the solid portion of the reticle.

4. The photolithography reticle of claim 2, wherein the solid portion and the plurality of sub-resolution line portions comprise chrome.

5. The photolithography reticle of claim 2, wherein the solid portion and each of the plurality of sub-resolution line portions are formed in a single reticle layer having a uniform thickness.

6. The photolithography reticle of claim 5, wherein substantially all of the plurality of sub-resolution line portions have the same width.

7. The photolithography reticle of claim 2, wherein substantially all of the sub-resolution line portions are spaced apart from the solid portion or from adjacent sub-resolution line portions by a distance which is less than the resolution of the exposure tool.

8. A method of producing a tapered sidewall in a substrate, the method comprising:
   depositing a layer of photoresist on the substrate;
   forming a photolithography reticle on the layer of photoresist, wherein forming the photolithography reticle further comprises:
      forming a solid reticle portion having a width which is greater than a resolution of an exposure tool; and
      forming a plurality of sub-resolution line portions, wherein each of the plurality of sub-resolution line portions has a width which is less than the resolution of the exposure tool, and wherein each of the sub-resolution line portions is spaced apart from the solid portion and from the others of the plurality of sub-resolution line portions;
   exposing the layer of photoresist to ultraviolet radiation, from the exposure tool, through the photolithography reticle;
   removing the photolithography reticle and portions of the layer of photoresist to form the tapered sidewall in the layer of photoresist; and
   removing additional portions of the layer of photoresist to form the tapered sidewall in substrate under the tapered sidewall in the layer of photoresist.

9. The method of claim 8, wherein forming the solid portion and each of the plurality of sub-resolution line portions of the photolithography reticle further comprises forming the solid portion and the plurality of sub-resolution line portions in a single reticle layer having a uniform thickness.

10. The method of claim 9, wherein forming the plurality of sub-resolution line portions further comprises forming the sub-resolution line portions such that substantially all of the plurality of sub-resolution line portions have a same width.

11. The method of claim 9, wherein forming the plurality of sub-resolution line portions further comprises forming the line portions such that substantially all of the sub-resolution line portions are spaced apart from the solid portion or from adjacent sub-resolution line portions by a distance which is less than the resolution of the exposure tool.

12. The method of claim 9, wherein forming the plurality of sub-resolution line portions further comprises forming the line portions such that for each of the plurality of sub-resolution line portions, spacings between the sub-resolution line portion and adjacent sub-resolution line portions are substantially a function of distance between the sub-resolution line portion and the solid portion of the reticle.

13. The method of claim 12, wherein forming the plurality of sub-resolution line portions further comprises forming the line portions such that spacing between particular sub-resolution line portions and adjacent sub-resolution line portions increases as a function of distance between the particular sub-resolution line portions from the solid portion of the reticle.

14. The method of claim 9, forming the plurality of sub-resolution line portions further comprises forming the photolithography reticle further comprises forming the solid portion and the plurality of sub-resolution line portions from chrome.

* * * * *